US008872088B2

(12) United States Patent
Zhang et al.

(10) Patent No.: US 8,872,088 B2
(45) Date of Patent: Oct. 28, 2014

(54) NOISE-MATCHING DYNAMIC BIAS FOR COLUMN RAMP COMPARATORS IN A CMOS IMAGE SENSOR

(75) Inventors: Guangbin Zhang, Cupertino, CA (US); Zhiqiang Song, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 312 days.

(21) Appl. No.: 13/585,492

(22) Filed: Aug. 14, 2012

(65) Prior Publication Data

US 2014/0048685 A1 Feb. 20, 2014

(51) Int. Cl.
*H01L 27/00* (2006.01)
*H01L 27/146* (2006.01)
*H03F 3/08* (2006.01)

(52) U.S. Cl.
CPC .......... *H01L 27/14641* (2013.01); *H03F 3/087* (2013.01)
USPC ..................... 250/208.1; 250/214 A; 327/561

(58) Field of Classification Search
USPC .................. 250/208.1, 214.1, 214 R, 214 A; 257/431; 327/561
See application file for complete search history.

(56) References Cited

U.S. PATENT DOCUMENTS

| 5,883,378 | A  | * | 3/1999 | Irish et al. ................. | 250/214 A |
| 8,314,868 | B2 | * | 11/2012 | Yamamoto ..................... | 348/294 |
| 2008/0231330 | A1 | * | 9/2008 | Takahashi et al. ............ | 327/137 |

OTHER PUBLICATIONS

Wei Gao, "Low Power Design Methodologies in Analog Blocks of CMOS Image Sensors," Graduate Program in Computer Science and Engineering Department, York University, Toronto, Ontario, Canada, Mar. 2011, 191 pages.

* cited by examiner

*Primary Examiner* — Francis M Legasse, Jr.
(74) *Attorney, Agent, or Firm* — Blakely Sokoloff Taylor & Zafman LLP

(57) ABSTRACT

Embodiments of an image sensor including a pixel array with a plurality of pixels arranged into rows and columns. Control circuitry coupled to the pixels in each row, and an analog-to-digital converter is coupled to the pixels in each column of the pixel array. Each analog-to-digital converter includes a ramp comparator, and a variable current source coupled to the ramp comparator to provide a variable bias current to the ramp comparator. The bias current can adjusted during reading of a row of pixels according to a dynamic bias current profile that maintains at least a specified margin between the random noise of the pixels and an acceptable noise level. Other embodiments are disclosed and claimed.

18 Claims, 6 Drawing Sheets

NOISE-MATCHING DYNAMIC BIAS FOR COLUMN RAMP COMPARATORS IN A CMOS IMAGE SENSOR

TECHNICAL FIELD

The present invention relates generally to image sensors and in particular, but not exclusively, to noise-matching dynamic bias for column ramp comparators in CMOS image sensors.

BACKGROUND

Image sensors are widely used in digital still cameras, cellular phones and security cameras, as well as medical, automobile, and other applications. The twin demands of higher resolution and lower power consumption have encouraged further miniaturization and integration of image sensors, and the technology used to manufacture the sensors, especially complementary metal oxide semiconductor ("CMOS") image sensors, has continued to advance at great pace to meet the demands. The portable nature of many devices in which image sensors are used means that they are battery-powered, and that places particular emphasis on reducing image sensor power consumption so that the device's battery life can be as long as possible. Despite substantial advances in lowering power consumption of the image sensors, ways remain for further reduction in power consumption.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, system and method are described for noise-matching dynamic bias for column ramp comparators in a CMOS image sensor. Numerous specific details are described to provide a thorough understanding of embodiments of the invention, but one skilled in the relevant art will recognize that the invention can be practiced without one or more of the specific details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
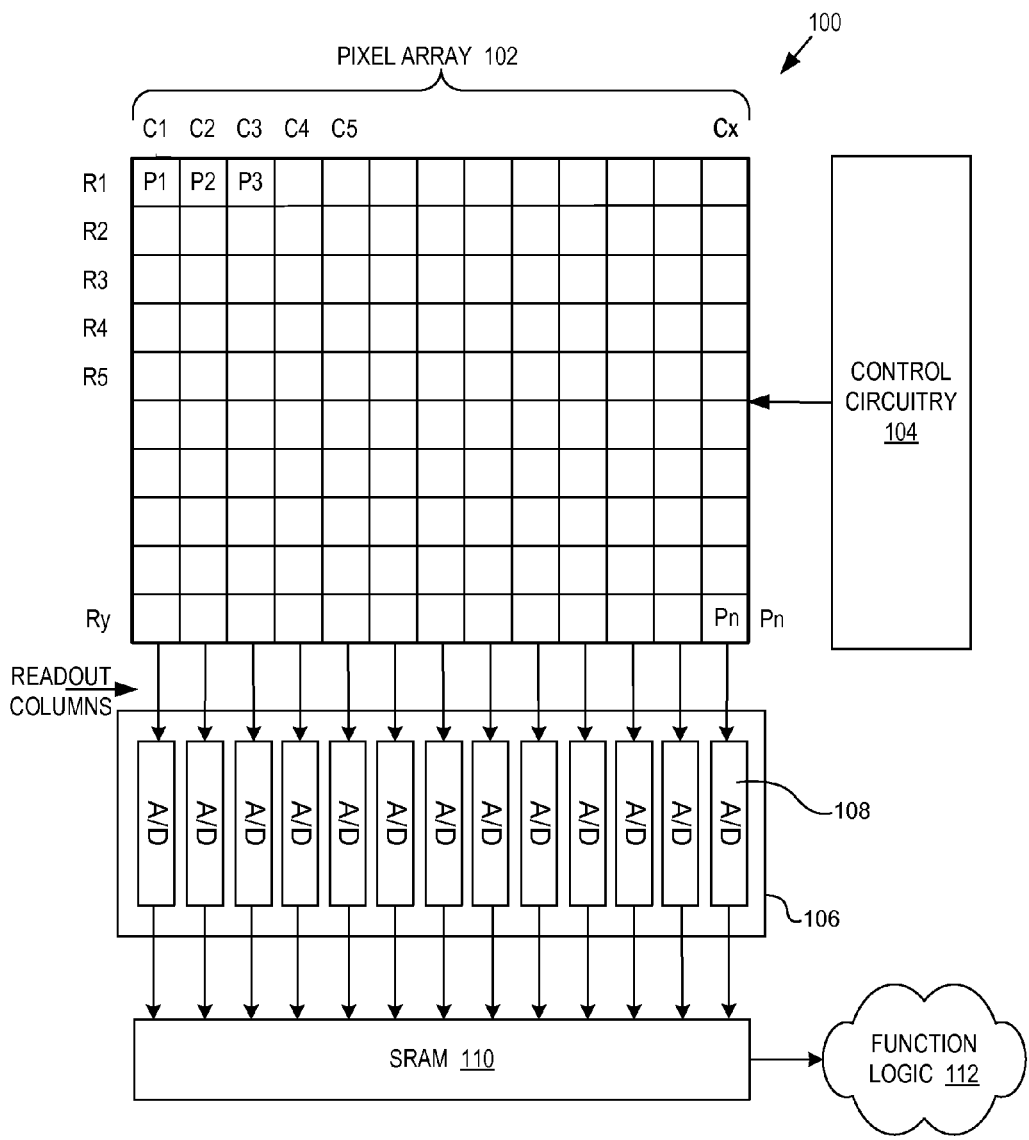
FIG. 1 is a schematic drawing of an embodiment of an image sensor.

FIG. 1A illustrates an embodiment of an image sensor 100. Image sensor 100 includes a pixel array 102, control circuitry 104, readout circuitry 106, function logic SRAM 110, and function logic 110.

Pixel array 102 is a two-dimensional array of image sensor elements or pixels (e.g., pixels P1, P2 . . . , Pn). In one embodiment, each pixel can be a front-side illuminated complementary metal-oxide-semiconductor ("CMOS") imaging pixel. In embodiments of pixel array intended to capture color images, pixel array 102 can include a color filter pattern, such as a Bayer pattern or mosaic of red, green, and blue filters (e.g., RGB, RGBG or GRGB); a color filter pattern of cyan, magenta and yellow (e.g., CMY); a combination of both, or otherwise. As illustrated, the pixels in the pixel array are arranged into a rows (e.g., rows R1 to Ry) and columns (e.g., column C1 to Cx) to acquire image data of a person, place, or object, which can then be used to render a 2D image of the person, place, or object.

Control circuitry 104 is coupled to pixel array 105 to control operational characteristic of the array. For example, control circuitry 110 can generate a shutter signal for controlling image acquisition. In one embodiment, the shutter signal can be a global shutter signal for simultaneously enabling all pixels within pixel array 105 to simultaneously capture their respective image data during a single acquisition window. In an alternative embodiment, the shutter signal is a rolling shutter signal whereby each row, column, or group of pixels is sequentially enabled during consecutive acquisition windows. Control circuitry 104 also controls the readout of the image data after it is acquired, for example by using a rolling readout scheme that reads the image data row by row, and column by column within each row.

Readout circuitry 106 is coupled to pixel array 102 and control circuitry 104 to read out and digitize the pixel data after each pixel has acquired its image data or image charge. Readout circuitry 106 can include amplification circuitry, analog-to-digital ("ADC") conversion circuitry, or otherwise. In the illustrated embodiment, readout circuitry includes a plurality of ADCs, such that each column of the pixel array has its own ADC. In other embodiments of image sensor 100, there need not be a one-to-one correspondence between columns and ADCs—in other words, in other embodiments each ADC can be coupled to more than one pixel column. In other embodiments, readout circuitry 106 can read out the image data using a variety of other techniques (not illustrated), such as a column readout, a serial readout, or a full parallel readout of all pixels simultaneously.

After each pixel in pixel array 102 has acquired its image data or image charge, the image data is read out by readout circuitry 106 and then transferred to SRAM 110, where it can be held permanently, or can be held temporarily until it can be transferred to function logic 115. Function logic 115 may simply store the image data or even manipulate the image data via an image processor by applying post-image effects such as image compression, crop, rotate, remove red eye, adjust brightness, adjust contrast, or otherwise.

Figure 2A:
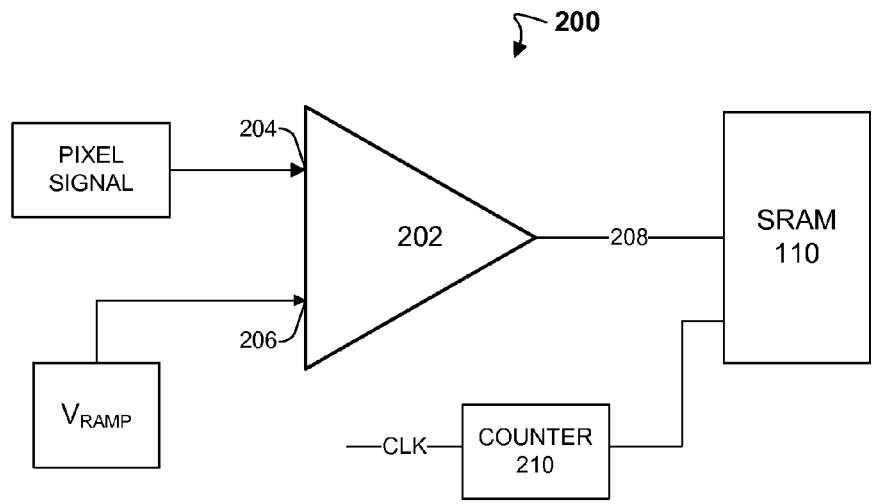
FIG. 2A is a schematic of an embodiment of a ramp comparator configured to operate as an analog-to-digital converter (ADC).

FIG. 2A illustrates an embodiment of an analog-to-digital converter (ADC) 200. ADC 200 includes an operational amplifier (op-amp) 202 configured to act as a ramp comparator. Op-amp 202 includes a signal input 204 to which the pixel signal is coupled, and a reference input 206 to which a ramp voltage is coupled. When configured this way, op-amp 202 compares the two inputs of op-amp 202. When the pixel signal to the ramp signal and generates an output that is digital write signal 208. The digital output of op-amp 202 is coupled to the input of static random access memory (SRAM) 110. When the inputs of op-amp 202 are equal, digital write signal 208 can be sent to SRAM 110, at which time the current value of counter 210 is written into SRAM 110.

Figure 2B:
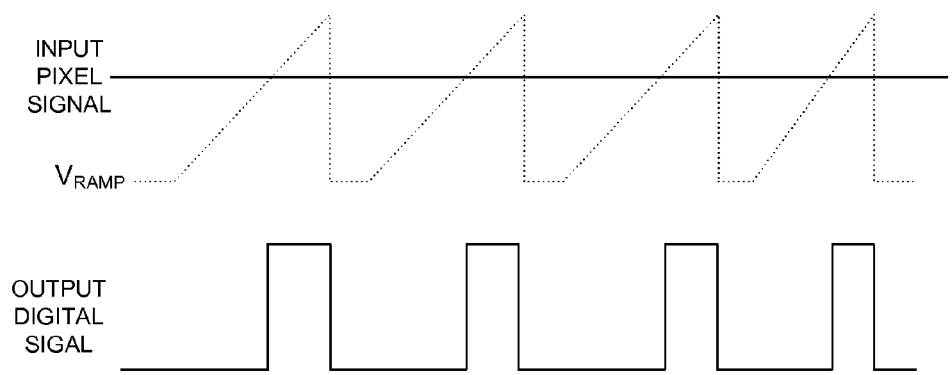
FIG. 2B is a drawing illustrating the inputs and outputs of a ramp comparator used as an analog-to-digital converter (ADC).

FIG. 2B illustrates the inputs and outputs of the ramp comparator 202; the top figure shows the analog inputs, the bottom figure shows the corresponding digital output. The analog inputs to op-amp 202 are the pixel signal and a substantially ramp-shaped reference signal. Op-amp 202 compares the pixel signal to the reference signal. If the pixel signal is equal to the ramp signal, the output is a high voltage—that is, a digital "1." But if the pixel signal is less than the ramp signal, the output is a low voltage—that is, a digital "0," as shown in the figure.

Figure 3:
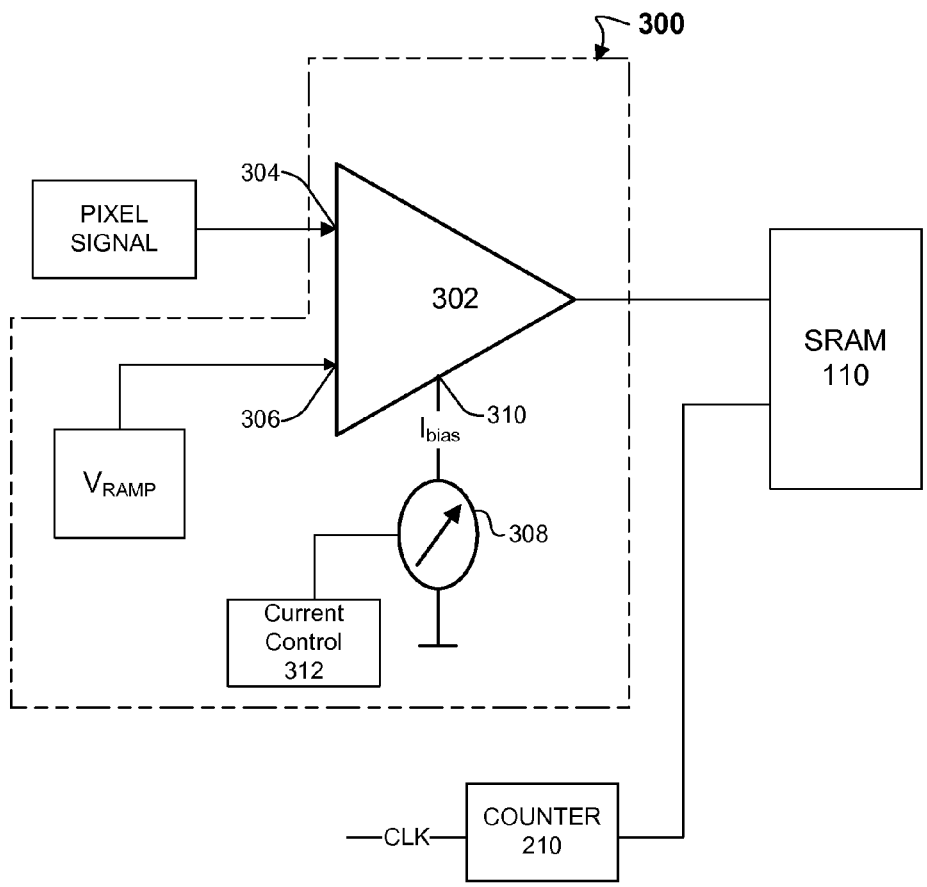
FIG. 3 is a schematic of an embodiment of a ramp comparator including a variable bias current source.

FIG. 3 illustrates an embodiment of a single-stage analog-to-digital converter (ADC) 300. ADC 300 includes an operational amplifier (op-amp) 302 configured to act as a ramp comparator. Op-amp 302 includes a signal input 304 to which a pixel signal is coupled, and a reference input 306 to which a ramp voltage is coupled. A variable current source 308 is coupled to the power input 310 of op-amp 302, and a current control 312 can be coupled to variable current source 308. The output of op-amp 302 is coupled to the input of static random access memory (SRAM) 110. When the inputs of op-amp 202 equal, digital write signal 208 may be sent to SRAM 110, at which time the current value of counter 210 is written into SRAM 110.

Variable current source 308 provides a variable bias current input ($I_{bias}$) to op-amp 302. In the illustrated embodiment, variable current source 308 is coupled to the power input of op-amp 302, but in other embodiments the variable current source 308 could be coupled to the signal input 304 or coupled to the reference input 306. Variable current source 308 is also coupled to a current control 312, which includes circuitry and logic to control the value of the output $I_{bias}$ of the variable current source, allowing variable current source 308 to apply a dynamic bias current profile—that is, a variation of bias current $I_{bias}$ with time—to op-amp 302. An example of a dynamic bias current profile is illustrated and explained further below in connection with FIGS. 5 and 6A-6B.

Figure 4:
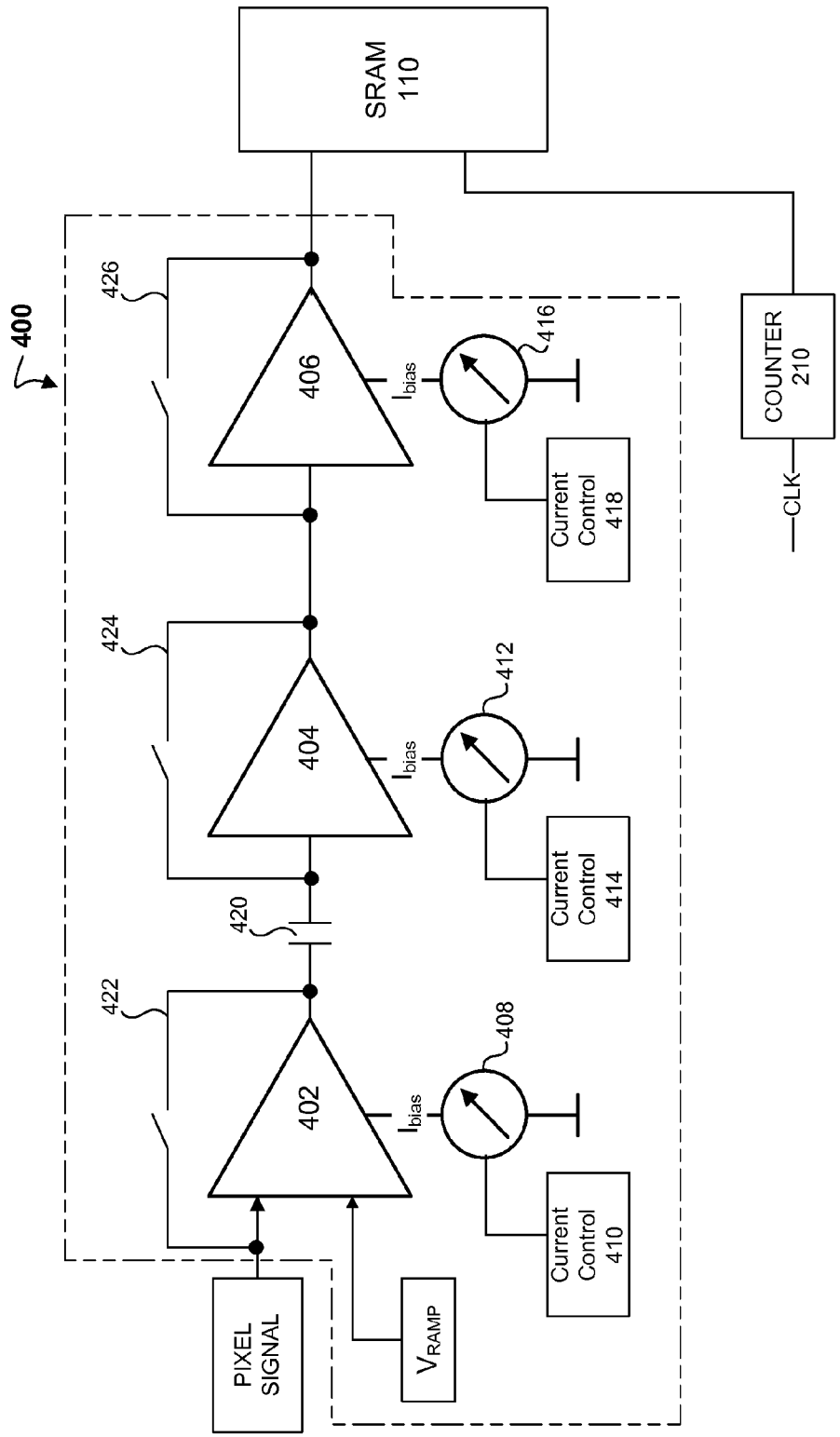
FIG. 4 is a schematic of an alternative embodiment of a ramp comparator including variable bias current sources.

FIG. 4 illustrates an embodiment of a multi-stage analog-to-digital converter (ADC) 400. In the illustrated embodiment ADC 400 uses three op-amps configured to operate as ramp comparators, but other multi-stage embodiments can include more or less op-amps. ADC 400 includes a first op-amp 402, a second op-amp 404, and a third op-amp 406, with first op-amp 402 configured to operate as a ramp comparator. Op-amp 402 includes a signal input to which a pixel signal is coupled and a reference input to which a ramp voltage is coupled. A variable current source 408 is coupled to the power input of op-amp 402, and a current control 410 can be coupled to variable current source 408. Current control 410 includes circuitry logic therein to control the value of the output $I_{bias}$ of the variable current source 408 so that a dynamic bias current profile can be applied to op-amp 402.

An auto-reset 422 is coupled to the pixel signal input of op-amp 402 the output of op-amp 402.

Second op-amp 404 its signal input coupled through a capacitor 420 to the output of first op-amp 402. Unlike first op-amp 402, second op-amp 404 configured as a single-ended input op-amp. The power input of op-amp 404 is coupled to a variable current source 412. Variable current source 412 is coupled to a current control 414 which, like current control 412, includes circuitry logic therein to control the value of the output $I_{bias}$ of variable current source 412 so that a dynamic bias current profile can be applied to op-amp 404. An auto-reset 424 is coupled to the pixel signal input of op-amp 402 and to the output of op-amp 402.

Third op-amp 406 has its signal input coupled to the output of second op-amp 404. Similar to second op-amp 404, third op-amp 406 is configured as a single-ended input op-amp. The power input of op-amp 406 is coupled to a variable current source 416. Variable current source 416 is coupled to a current control 418 that includes circuitry and logic to control the value of the output $I_{bias}$ of variable current source 416 so that a dynamic bias current profile can be applied to op-amp 406. An auto-reset 426 is coupled to the pixel signal input of op-amp 402 and to the output of op-amp 402. The output of op-amp 406 is coupled to a static random access memory (SRAM) 110, and SRAM 110 is in turn coupled to clocked counter 210.

In the illustrated embodiment of ADC 400, each of the op-amps 402, 404 and 406 has its own current control 414, but in other embodiments the current controls can be combined into a single controller coupled to all three op-amps. In one embodiment, the same dynamic bias current profile can be applied to every op-amp, regardless of whether the op-amps have their own controllers or share a common controller, but in other embodiments different dynamic bias current profiles can be applied to the different op-amps. An embodiment of a dynamic bias current profile is further explained below in connection with FIGS. 5 and 6A-6B.

Figure 5:
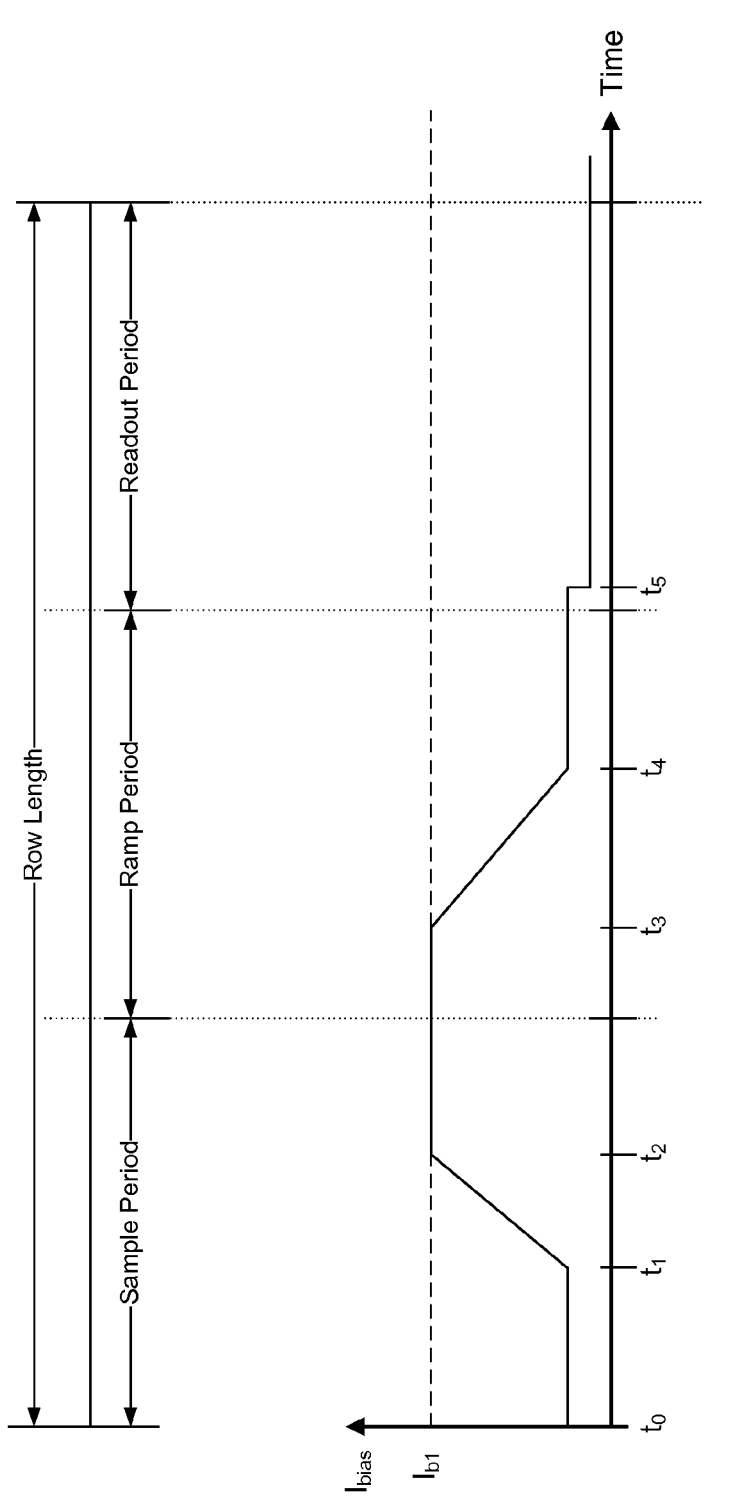
FIG. 5 is a graph of an embodiment of a dynamic bias current profile that can be used with the ramp comparators of FIGS. 3-4.

FIG. 5 illustrates an embodiment of a dynamic bias current profile that can be applied to the op-amp in single-stage ADC 300, or to one or more of the op-amps in multi-stage ADC 400. In the illustrated dynamic bias current profile, the vertical axis represents the bias current ($I_{bias}$) applied to the op-amp, while the horizontal axis represents time. The solid line in the graph illustrates an embodiment of a dynamic bias current profile, while the dashed horizontal line illustrates a constant bias current.

The dynamic bias current profile is divided into three principal periods: the sample period, the ramp period, and the readout period. In the sample period, the bias current starts out at time $t_0$ at a low level which is maintained until time $t_1$. Between $t_1$ and $t_2$, the bias current is ramped up to a value $I_{b1}$, which in one embodiment can be a bias current substantially equal to the bias current that would be used in a constant bias current scheme. Time $t_2$ is set to occur before the ramp period starts so that the bias current $I_{bias}$ can reach the desired level and can stabilize by the beginning of the ramp period.

From time $t_2$ which occurs during the sampling period until time $t_3$, which occurs during the ramping period the bias current is maintained at its high level. Beginning at time $t_3$, the bias current can be ramped down from its high level to a lower level at time $t_4$, which is also within the ramp period. The lower bias current level at $t_4$, as well as the rate at which the bias current decreases between $t_3$ and $t_4$, are determined by the signal level and the necessity to maintain a specified noise margin that will yield acceptable image quality. Between $t_4$ and $t_5$, the bias current is held at the lower level; $t_5$ is within the readout period, meaning that the same lower bias current level is held from $t_4$ until at least the end of the ramp period. After time $t_5$ the bias current can be lowered even further for the remainder of the readout. In one embodiment, after $t_5$ the bias current can be lowered to zero, but in most embodiments the bias current will not be lowered to zero so that it can be ramped up more quickly at the beginning of the next sample period.

Figure 6A:
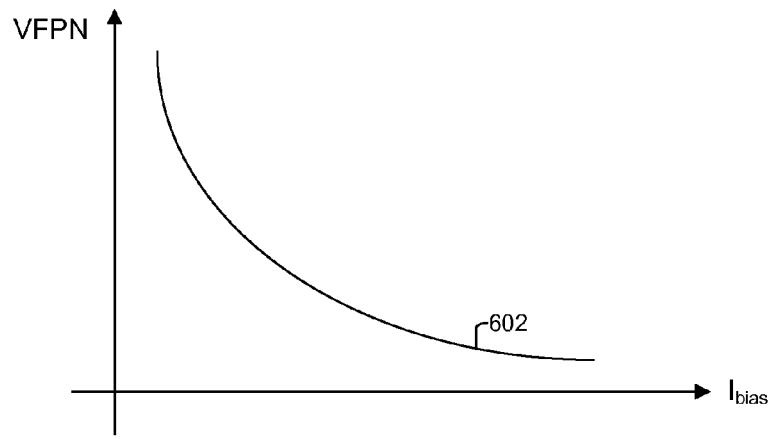
FIG. 6A is a graph of an embodiment of the relationship between pixel array fixed pattern noise (FPN) and comparator bias current.
Figure 6B:
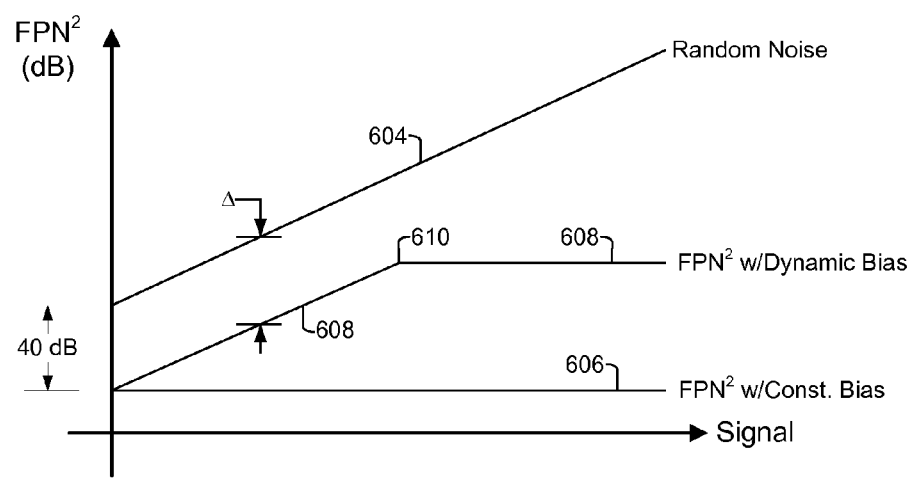
FIG. 6B is a graph of an embodiment of the relationship between the output signal and fixed pattern noise (FPN) in an image sensor.

FIGS. 6A-6B illustrate an embodiment of how the dynamic bias current profile, one embodiment of which is shown in FIG. 5, is formulated. FIG. 6A illustrates generally the relationship between bias current and vertical fixed pattern noise (VFPN) in an image sensor; for a particular image sensor, the relationship between bias current and VFPN is generally determined by testing. As shown by curve 602 the relationship is generally an inverse relationship, meaning that fixed pattern noise declines with increasing bias current. In the illustrated embodiment the inverse relationship is nonlinear and hyperbolic in appearance, but in other embodiments the inverse relationship between bias current and fixed pattern noise can take other forms, such as a linear relationship or some other relationship than the one shown.

FIG. 6B illustrates the relationship between vertical fixed pattern noise (or, more precisely, the square of fixed pattern noise, $FPN^2$) and output signal in an image sensor. Top curve 604 shows the relationship between FPN and signal when no bias current is applied during analog-to-digital conversion; generally, it is a direct relationship, meaning that FPN increases with signal strength. Bottom line 606 shows a relationship between FPN and signal strength when a constant-bias-current scheme is applied during analog-to-digital conversion of the signal. In such a case FPN remain substantially constant, meaning it does not vary greatly with signal strength. As can be seen from the graph, the margin between curve 604, where no bias current is applied, and curve 606, where constant bias current is applied, increases with signal level. But at a certain signal level the margin between curve 604 and curve 606 becomes larger than necessary to obtain acceptable image quality—that is, larger than needed to obtain images with acceptably low noise. The larger-than-necessary margin means that beyond a certain signal level, a constant bias current scheme is overdesigned. The overdesign means that the bias current used is too high, and the too-high current translates directly into excessive power usage.

Middle line 608 shows a relationship that maintains a fixed noise margin throughout most of the signal range, and forms the basis of the dynamic bias current profile shown in FIG. 5. As discussed above, FIG. 6A establishes that FPN rises with decreasing op-amp bias current. As a result, in curve 608 the bias current decreases with signal strength at a rate that maintains a substantially constant margin $\Delta$ between curves 604 and 608, instead of the monotonically increasing margin that exists between random noise curve 604 and the constant-bias curve 608. This decreasing bias current to maintain the constant $\Delta$ between curve 608 and curve 604 corresponds to the declining bias current between times $t_3$ and $t_4$ in FIG. 5. In the illustrated embodiment, the noise margin $\Delta$ is substantially 40 dB, but in other embodiments the noise margin can have lower values, for example substantially 20 dB, or higher values, for example substantially 60 dB.

As shown in the figure, at signal levels higher than the signal level at point 610 on curve 608, the noise margin $\Delta$ is no longer constant but instead begins to increase. This is because at some point it becomes necessary to stop decreasing the bias current to avoid having it go all the way down to zero. Not allowing the bias current to go all the way down to zero is desirable so that the op-amp will be more responsive—that is, that the bias current can be ramped up again more quickly—in the next read cycle (i.e., in the reading of the next row of pixels in the pixel array).

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An image sensor comprising:
a pixel array having a plurality of pixels arranged into rows and columns;
control circuitry coupled to the pixels in each row;
an analog-to-digital converter coupled to the pixels in each column of the pixel array, each analog-to-digital converter comprising:
a ramp comparator, and
a variable current source coupled to the ramp comparator to provide a variable bias current to the ramp comparator,
wherein the bias current is adjusted during reading of a row of pixels according to a dynamic bias current profile that maintains at least a specified margin between the random noise of the pixels and an acceptable noise level.

2. The apparatus of claim 1 wherein the ramp comparator is an operational amplifier configured to function as a comparator.

3. The apparatus of claim 1 wherein the ramp comparator is a single-stage comparator comprising a single operational amplifier.

4. The apparatus of claim 1 wherein the ramp comparator is a multi-stage comparator comprising multiple operational amplifiers.

5. The apparatus of claim 4 wherein each of the multiple operational amplifiers is coupled to a variable current source that can provide a variable bias current to its respective operational amplifier.

6. The apparatus of claim 5 wherein the bias current in each of the multiple operational amplifiers is adjusted according to the same bias current profile.

7. The apparatus of claim 1 wherein the bias current profile is determined based on the noise curve of the pixel array and a specified margin between the fixed pattern noise of the pixel array and a noise level that produces acceptable image quality.

8. The apparatus of claim 7 wherein the specified margin is substantially between 20 dB and 40 dB.

9. The apparatus of claim 1, further comprising:
a static random access memory (SRAM) coupled to the output of the analog-to-digital converter; and
a clocked counter coupled to the SRAM.

10. A process comprising:
coupling an analog-to-digital converter to each column of a pixel array having a plurality of pixels arranged into rows and columns and having control circuitry coupled to the pixel array, each analog-to-digital converter comprising:
    a ramp comparator, and
    a variable current source coupled to the ramp comparator to provide a variable bias current to the ramp comparator; and
adjusting the bias current during reading of a row of pixels according to a bias current profile that maintains at least a specified margin between the random noise of the pixels and an acceptable noise level.

11. The process of claim 10 wherein the ramp comparator is an operational amplifier configured to function as a comparator.

12. The process of claim 10 wherein the ramp comparator is a single-stage comparator comprising a single operational amplifier.

13. The process of claim 10 wherein the ramp comparator is a multi-stage comparator comprising multiple operational amplifiers.

14. The process of claim 13 wherein each of the multiple operational amplifiers is coupled to a variable current source that can provide a variable bias current to its respective operational amplifier.

15. The process of claim 14 wherein the bias current in each of the multiple operational amplifiers in the multi-stage ramp comparator is adjusted according to the same bias current profile.

16. The process of claim 10 wherein the bias current profile is determined based on the noise curve of the pixel array and a specified margin between the fixed pattern noise of the pixel array and a noise level that produces acceptable image quality.

17. The process of claim 16 wherein the specified margin is substantially between 20 dB and 40 dB.

18. The process of claim 10, further comprising:
    coupling a static random access memory (SRAM) to the output of the analog-to-digital converter; and
    coupling a clocked counter to the SRAM.

\* \* \* \* \*